US011042307B1

(12) United States Patent
Li

(10) Patent No.: US 11,042,307 B1
(45) Date of Patent: Jun. 22, 2021

(54) SYSTEM AND METHOD FOR FACILITATING IMPROVED UTILIZATION OF NAND FLASH BASED ON PAGE-WISE OPERATION

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 16/741,313

(22) Filed: Jan. 13, 2020

(51) Int. Cl.
| | |
|---|---|
| *G06F 3/06* | (2006.01) |
| *G11C 16/10* | (2006.01) |
| *G11C 16/16* | (2006.01) |
| *G11C 11/56* | (2006.01) |
| *G11C 16/04* | (2006.01) |

(52) U.S. Cl.
CPC .......... *G06F 3/0616* (2013.01); *G06F 3/0652* (2013.01); *G06F 3/0659* (2013.01); *G06F 3/0679* (2013.01); *G11C 11/5628* (2013.01); *G11C 16/10* (2013.01); *G11C 16/16* (2013.01); *G11C 16/0483* (2013.01)

(58) Field of Classification Search
None
See application file for complete search history.

(56) References Cited

U.S. PATENT DOCUMENTS

| | | |
|---|---|---|
| 4,775,932 A | 10/1988 | Oxley |
| 6,148,377 A | 11/2000 | Carter |
| 6,226,650 B1 | 5/2001 | Mahajan et al. |
| 6,243,795 B1 | 6/2001 | Yang |
| 7,565,454 B2 | 7/2009 | Zuberi |

(Continued)

FOREIGN PATENT DOCUMENTS

| | | |
|---|---|---|
| JP | 2003022209 | 1/2003 |
| JP | 2011175422 | 9/2011 |

(Continued)

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — Tan T. Nguyen
(74) *Attorney, Agent, or Firm* — Shun Yao; Park, Vaughan, Fleming & Dowler LLP

(57) ABSTRACT

The system receives a request to write data to a non-volatile memory comprising blocks with a plurality of wordlines, wherein a respective wordline is coupled to a plurality of pages across a plurality of cells, and wherein the pages are ordered by an increasing number of programmable bits per cell. In response to determining that the data is not an updated version of data stored in the non-volatile memory, the system writes the data to a first ordered page of a plurality of pages corresponding to a next available wordline. In response to determining that the data is an updated version of existing data stored in the non-volatile memory, the system writes the data to a next available ordered page corresponding to an existing wordline in which the existing data is stored.

20 Claims, 10 Drawing Sheets

(56) References Cited

U.S. PATENT DOCUMENTS

| | | |
|---|---|---|
| 8,260,924 B2 | 9/2012 | Koretz |
| 8,452,819 B1 | 5/2013 | Sorenson, III |
| 8,516,284 B2 | 8/2013 | Chan |
| 8,751,763 B1 | 6/2014 | Ramarao |
| 8,825,937 B2 | 9/2014 | Atkisson |
| 8,949,208 B1 | 2/2015 | Xu |
| 9,043,545 B2 | 5/2015 | Kimmel |
| 9,088,300 B1 | 7/2015 | Chen |
| 9,092,223 B1 | 7/2015 | Pani |
| 9,280,472 B1 | 3/2016 | Dang |
| 9,280,487 B2 | 3/2016 | Candelaria |
| 9,529,601 B1 | 12/2016 | Dharmadhikari |
| 9,588,698 B1 | 3/2017 | Karamcheti |
| 9,588,977 B1 | 3/2017 | Wang |
| 10,013,169 B2 | 7/2018 | Fisher |
| 10,235,198 B2 | 3/2019 | Qiu |
| 2002/0010783 A1 | 1/2002 | Primak |
| 2002/0073358 A1 | 6/2002 | Atkinson |
| 2002/0161890 A1 | 10/2002 | Chen |
| 2003/0074319 A1 | 4/2003 | Jaquette |
| 2003/0163594 A1 | 8/2003 | Aasheim |
| 2003/0163633 A1 | 8/2003 | Aasheim |
| 2004/0010545 A1 | 1/2004 | Pandya |
| 2004/0143718 A1 | 7/2004 | Chen |
| 2004/0255171 A1 | 12/2004 | Zimmer |
| 2004/0268278 A1 | 12/2004 | Hoberman |
| 2005/0038954 A1 | 2/2005 | Saliba |
| 2005/0097126 A1 | 5/2005 | Cabrera |
| 2005/0144358 A1* | 6/2005 | Conley ............... G06F 12/0246 711/103 |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0156012 A1 | 7/2006 | Beeson |
| 2007/0033323 A1 | 2/2007 | Gorobets |
| 2007/0101096 A1 | 5/2007 | Gorobets |
| 2008/0034154 A1 | 2/2008 | Lee |
| 2009/0113219 A1 | 4/2009 | Aharonov |
| 2009/0282275 A1 | 11/2009 | Yermalayeu |
| 2009/0307249 A1 | 12/2009 | Koifman |
| 2009/0310412 A1 | 12/2009 | Jang |
| 2010/0031000 A1 | 2/2010 | Flynn |
| 2010/0169470 A1 | 7/2010 | Takashige |
| 2010/0229224 A1 | 9/2010 | Etchegoyen |
| 2010/0241848 A1 | 9/2010 | Smith |
| 2010/0321999 A1 | 12/2010 | Yoo |
| 2010/0325367 A1 | 12/2010 | Kornegay |
| 2011/0055458 A1 | 3/2011 | Kuehne |
| 2011/0072204 A1 | 3/2011 | Chang |
| 2011/0099418 A1 | 4/2011 | Chen |
| 2011/0153903 A1 | 6/2011 | Hinkle |
| 2011/0218969 A1 | 9/2011 | Anglin |
| 2011/0231598 A1 | 9/2011 | Hatsuda |
| 2011/0292538 A1 | 12/2011 | Haga |
| 2011/0302353 A1 | 12/2011 | Confalonieri |
| 2012/0039117 A1 | 2/2012 | Webb |
| 2012/0084523 A1 | 4/2012 | Littlefield |
| 2012/0117399 A1 | 5/2012 | Chan |
| 2012/0147021 A1 | 6/2012 | Cheng |
| 2012/0159289 A1 | 6/2012 | Piccirillo |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2013/0013880 A1 | 1/2013 | Tashiro |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0219131 A1 | 8/2013 | Alexandron |
| 2013/0318283 A1 | 11/2013 | Small |
| 2013/0318395 A1 | 11/2013 | Kalavade |
| 2014/0082273 A1 | 3/2014 | Segev |
| 2014/0108414 A1 | 4/2014 | Stillerman |
| 2014/0181532 A1 | 6/2014 | Camp |
| 2014/0233950 A1 | 8/2014 | Luo |
| 2014/0250259 A1 | 9/2014 | Ke |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0082317 A1 | 3/2015 | You |
| 2015/0106556 A1 | 4/2015 | Yu |
| 2015/0106559 A1 | 4/2015 | Cho |
| 2015/0142752 A1 | 5/2015 | Chennamsetty |
| 2015/0143030 A1* | 5/2015 | Gorobets ............ G11C 11/5621 711/103 |
| 2015/0227316 A1 | 8/2015 | Warfield |
| 2015/0277937 A1 | 10/2015 | Swanson |
| 2015/0304108 A1 | 10/2015 | Obukhov |
| 2015/0363271 A1 | 12/2015 | Haustein |
| 2015/0372597 A1 | 12/2015 | Luo |
| 2016/0014039 A1 | 1/2016 | Reddy |
| 2016/0098344 A1 | 4/2016 | Gorobets |
| 2016/0110254 A1 | 4/2016 | Cronie |
| 2016/0188223 A1 | 6/2016 | Camp |
| 2016/0188890 A1 | 6/2016 | Naeimi |
| 2016/0232103 A1 | 8/2016 | Schmisseur |
| 2016/0239074 A1 | 8/2016 | Lee |
| 2016/0239380 A1 | 8/2016 | Wideman |
| 2016/0274636 A1 | 9/2016 | Kim |
| 2016/0306853 A1 | 10/2016 | Sabaa |
| 2016/0343429 A1 | 11/2016 | Nieuwejaar |
| 2016/0350002 A1 | 12/2016 | Vergis |
| 2017/0075583 A1 | 3/2017 | Alexander |
| 2017/0075594 A1 | 3/2017 | Badam |
| 2017/0109232 A1 | 4/2017 | Cha |
| 2017/0147499 A1 | 5/2017 | Mohan |
| 2017/0162235 A1 | 6/2017 | De |
| 2017/0168986 A1 | 6/2017 | Sajeepa |
| 2017/0212708 A1 | 7/2017 | Suhas |
| 2017/0228157 A1 | 8/2017 | Yang |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0285976 A1 | 10/2017 | Durham |
| 2017/0286311 A1 | 10/2017 | Juenemann |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0088867 A1 | 3/2018 | Kaminaga |
| 2018/0143780 A1 | 5/2018 | Cho |
| 2018/0150640 A1 | 5/2018 | Li |
| 2018/0167268 A1 | 6/2018 | Liguori |
| 2018/0189182 A1 | 7/2018 | Wang |
| 2018/0270110 A1 | 9/2018 | Chugtu |
| 2018/0329776 A1 | 11/2018 | Lai |
| 2018/0349396 A1 | 12/2018 | Blagojevic |
| 2018/0373428 A1 | 12/2018 | Kan |
| 2019/0012111 A1 | 1/2019 | Li |
| 2019/0073262 A1 | 3/2019 | Chen |
| 2019/0205206 A1 | 7/2019 | Hornung |

FOREIGN PATENT DOCUMENTS

| | | |
|---|---|---|
| WO | 9418634 | 8/1994 |
| WO | 1994018634 | 8/1994 |

(56) References Cited

FOREIGN PATENT DOCUMENTS

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.
EMC Powerpath Load Balancing and Failover Comparison with native MPIO operating system solutions. Feb. 2011.
Tsuchiya, Yoshihiro et al. "DBLK: Deduplication for Primary Block Storage", MSST 2011, Denver, CO, May 23-27, 2011 pp. 1-5.
Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.
Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.
WOW: Wise Ordering for Writes—Combining Spatial and Temporal Locality in Non-Volatile Caches by Gill (Year: 2005).
Helen H. W. Chan et al. "HashKV: Enabling Efficient Updated in KV Storage via Hashing", https://www.usenix.org/conference/atc18/presentation/chan, (Year: 2018).

\* cited by examiner

SYSTEM AND METHOD FOR FACILITATING IMPROVED UTILIZATION OF NAND FLASH BASED ON PAGE-WISE OPERATION

BACKGROUND

Field

This disclosure is generally related to the field of data storage. More specifically, this disclosure is related to a system and method for facilitating improved utilization of NAND flash based on page-wise operation.

Related Art

Today, various storage systems are being used to store and access the ever-increasing amount of digital content. A storage system can include storage servers with one or more storage devices, and a storage device can include storage media with a non-volatile memory (such as a solid state drive (SSD) or a hard disk drive (HDD)). Current storage systems include storage drives with ever-increasing density, with the ability to store multiple bits in a single cell (e.g., Quad-Level Cell (QLC) Not-And (NAND) flash memory, which can store four bits per cell). This increased density can provide a reduction in cost and an increase in capacity. However, these higher density NAND cells require a coarse-grained operation unit, which can result in a sub-optimal usage of the NAND flash. For example, as the block size and programming page size increase, so increases the cost to pad dummy bits in order to fill an open block or page. Furthermore, as the size of the unit to be recycled increases, so increases the amount of valid data to be copied out during a garbage collection process.

These increases (due to padding and copying out valid data) can result in a decreased performance of the NAND flash, including the additional time spent on performing these writes and the increase in write amplification. Moreover, because each NAND cell has a limited number of program/erase cycles, the increase in write amplification may result in a decrease in lifespan (i.e., limited endurance) of the higher density NAND.

SUMMARY

One embodiment provides a system which facilitates operation of a non-volatile memory. During operation, the system receives a request to write data to a non-volatile memory comprising blocks with a plurality of wordlines, wherein a respective wordline is coupled to a plurality of pages across a plurality of cells, and wherein the pages are ordered by an increasing number of programmable bits per cell. In response to determining that the data is not an updated version of data stored in the non-volatile memory, the system writes the data to a first ordered page of a plurality of pages corresponding to a next available wordline. In response to determining that the data is an updated version of existing data stored in the non-volatile memory, the system writes the data to a next available ordered page corresponding to an existing wordline in which the existing data is stored.

In some embodiments, the system detects a condition which triggers a garbage collection process on a first block of the non-volatile memory. The system identifies a first set of pages which comprise a most recent version of data stored in the first block. The system classifies, based on an access frequency of a respective page of the first set of pages, the respective page into a corresponding category of a set of categories. The system writes the respective classified page into one of a plurality of similarly classified regions of the non-volatile memory based on the corresponding category for the respective classified page. The system erases the first block.

In some embodiments, the categories are classifications which include at least a hot classification, a warm classification, and a cold classification. A page with a hot classification is written to a hot region of the non-volatile memory; a page with a warm classification is written to a warm region of the non-volatile memory; and a page with a cold classification is written to a cold region of the non-volatile memory.

In some embodiments, the system dynamically assigns a plane of the non-volatile memory as a hot, warm, or cold region based on the garbage collection process and further based on processing I/O requests, to obtain non-fixed and dynamically changing boundaries for the hot, warm, and cold regions of the non-volatile memory.

In some embodiments, the data is written as multiple replicas in a distributed storage system. In response to determining that a first replica stored in a warm block in the warm region meets a first predetermined threshold for being moved to an archival storage, the system writes the first replica to the archival storage and frees up the warm block to store incoming data. In response to determining that a second replica stored in a cold block in the cold region meets a second predetermined threshold for being moved to the archival storage, the system writes the second replica to the archival storage and frees up the cold block to store incoming data.

In some embodiments, the non-volatile memory comprises a plurality of channels, a respective channel comprises multiple planes, and a respective plane is assigned as a hot, warm, or cold region.

In some embodiments, the respective plane includes multiple blocks, at least one reserved block, and at least one spare block. The at least one reserved block is used for over-provisioning, and the at least one spare block is used for bad block management.

In some embodiments, the next available wordline is in a first area or a second area of a block in the non-volatile memory. The first area is assigned as a nominal capacity region of the block and the second area is assigned as a reserved region of the block.

In some embodiments, when the respective wordline stores data only in a first ordered page, the respective wordline operates in a Single-Level Cell (SLC) mode. When the respective wordline stores data only in the first ordered page and a second ordered page of the respective wordline, the respective wordline operates in a Multi-Level Cell (MLC) mode. When the respective wordline stores data only in the first ordered page, the second ordered page, and a third ordered page of the respective wordline, the respective wordline operates in a Triple-Level Cell (TLC) mode. When the respective wordline stores data only in the first ordered page, the second ordered page, the third ordered page, and a fourth ordered page of the respective wordline, the respective wordline operates in a QLC mode.

BRIEF DESCRIPTION OF THE FIGURES

In the figures, like reference numerals refer to the same figure elements.

DETAILED DESCRIPTION

Figure 1:
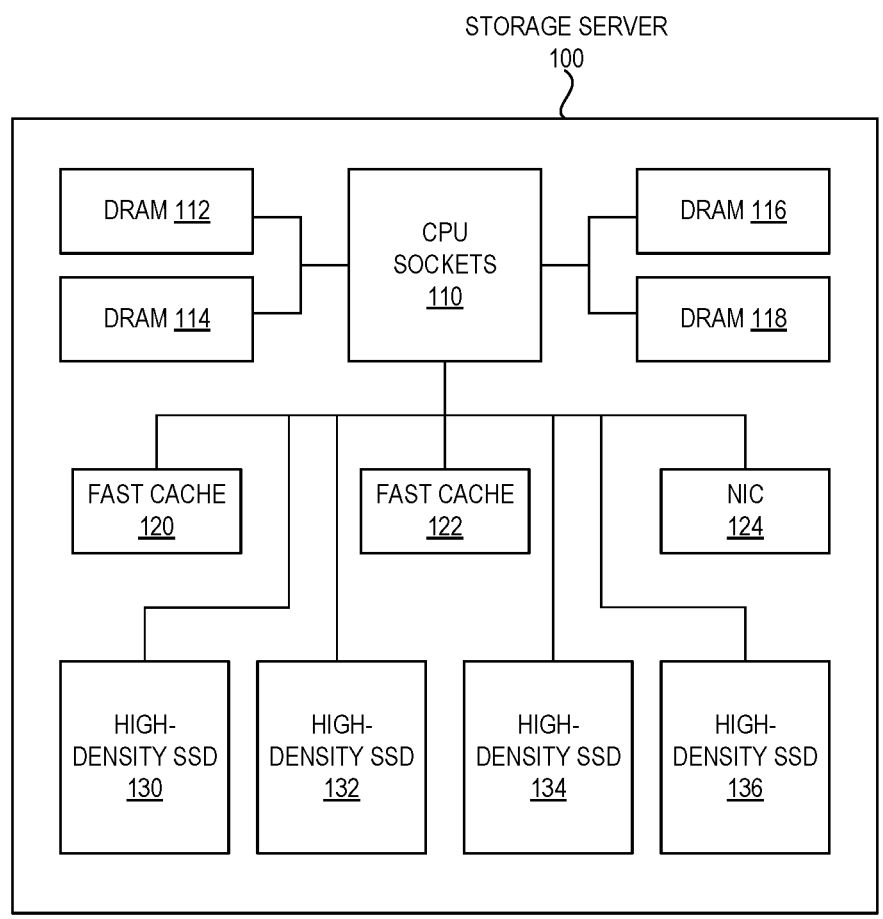
FIG. 1 illustrates an exemplary environment which facilitates operation of a storage system, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein facilitate a storage system which employs a gradual page-wise programming of NAND pages, two levels of overprovisioning, and classifying data based on "hotness" for future data movement to provide an efficient usage of high-density NAND.

As described above, the increased density of current NAND memory can provide a reduction in cost and an increase in capacity. However, these higher density NAND cells require a coarse-grained operation unit, which can result in a sub-optimal usage of the NAND flash. For example, as the block size and programming page size increase, so increases the cost to pad dummy bits in order to fill an open block or page. Furthermore, as the size of the unit to be recycled increases, so increases the amount of valid data to be copied out during a garbage collection process.

These increases (due to padding and copying out valid data) can result in a decreased performance of the NAND flash, including the additional time spent on performing these writes and the increase in write amplification. Moreover, because each NAND cell has a limited number of program/erase cycles, the increase in write amplification may result in a decrease in lifespan (i.e., limited endurance) of the higher density NAND.

One current storage system which uses a high-density NAND (e.g., a QLC NAND) pairs the QLC-based SSD with a fast cache which has a high endurance. The fast cache may have characteristics such as a high throughput, a low latency, and a high endurance, along with a high price. As a result, the fast cache is generally deployed only in small numbers as compared to the high-density NAND. Furthermore, deploying the fast cache with the high-density NAND can result in several drawbacks, including: a frequent update of hot data which triggers garbage collection; an increased idle capacity resulting from the mismatch between the amount of data capable of being processed simultaneously by the small numbers of fast cache and the ever-increasing numbers of high-density NAND; and the high error rate of high-density NAND, which can result in a long access latency. An exemplary current storage system is described below in relation to FIG. 1.

The embodiments described herein address these challenges by providing a storage system which re-constructs the allocation and recycling schemes used in current storage systems. The described storage system uses Triple-Level Cell (TLC) NAND as an exemplary flash memory, but the described storage system can also use any other multi-bit NAND flash, e.g., any NAND flash that stores multiple bits per cell.

TLC NAND can store three bits per cell. Multi-Level Cell (MLC) NAND can store two bits per cell. Single-Level Cell (SLC) NAND can store one bit per cell. The system can divide each NAND cell into three pages, e.g., a lower page, a middle page, and an upper page. The system can program each cell by first programming the lower page (operating in the SLC mode), by subsequently programming the middle mage (operating in the MLC mode), and finally by programming the upper page (operating in the TLC mode). An exemplary diagram of this gradual page-wise programming of the NAND memory is described below in relation to FIG. 2B, which also depicts the pages as ordered by an increasing number of programmable bits per cell.

A NAND block can include multiple wordlines, where a wordline can be coupled to a plurality of pages across a plurality of cells. Instead of using free blocks to provide redundancy, the system can allocate overprovisioning in a NAND block by reserving certain wordlines, as described below in relation to FIG. 3. In addition, each wordline can be flexibly programmed in a different mode (e.g., SLC, MLC, or TLC), based on many factors, including but not limited to: the amount of data being written; a frequency of access or updating; and a classified "hotness" category for the data. As part of the flexible programming, given an original version of data stored in a lower page of an original, the system can write updated data to a next available ordered page of the original wordline. By writing updated versions of existing data to the same wordline or block, the system can improve the garbage collection process by creating fewer "holes" in the data, as described below in relation to FIG. 4.

In addition, the hotness categories can include (e.g., in a TLC NAND which can program three bits per cell): hot; warm; and cold. Similarly, regions of the non-volatile memory may be assigned as hot, warm, or cold, such that classified data may be written to a corresponding classified region during the garbage collection process, as described below in relation to FIG. 4. For example, the system can store data in planes assigned to a hot, warm, or cold region, where each plane can include blocks for data storage, a reserved block for over-provisioning, and a spare block for bad block management, as described below in relation to FIG. 5.

In a distributed storage system with multiple replicas of data stored in a correspondingly classified region, the system can move the replicas to an archival storage based on certain factors, e.g.: a number of copies in a warm region or a cold region exceeding a first or second predetermined threshold number; and a predetermined interval of time for a certain replica in a warm or a cold region. Moving data to archival storage is described below in relation to FIG. 6.

Thus, by employing a gradual page-wise programming of NAND pages, by classifying data based on hotness, and by writing the classified data into corresponding classified zones or regions of the NAND, the system can reduce the number of data copies required in a subsequent garbage collection process, which can result in a reduced write amplification and an increased lifespan for the physical media of the high-density NAND flash. Furthermore, by providing overprovisioning at both the block level and the plane level, the system can further use the hotness classifications to move data in the system more efficiently, which can result in an improved performance for the overall storage system.

A "distributed storage system" or a "storage system" can include multiple storage servers. A "storage server" or a "storage system" can refer to a computing device which can include multiple storage devices or storage drives. A "storage device" or a "storage drive" refers to a device or a drive with a non-volatile memory which can provide persistent storage of data, e.g., a solid state drive (SSD) or a hard disk drive (HDD). A storage system can also be a computer system.

The term "hotness" as relating to a classification for data refers to an access frequency associated with the data. The access frequency can include: a number of times that the data has been accessed or updated in a predetermined period or interval or time; a period of time since a most recent access or update to the data; and any other measure which relates to how frequently or an interval during which the data has been or has not been accessed or updated. In this disclosure, three levels of hotness are used, including: hot; warm; and cold. Hot data can have an access frequency greater than a first predetermined threshold; warm data can have an access frequency less than the first predetermined threshold, but greater than a second predetermined threshold; and cold data can have an access frequency less than the second predetermined threshold. Fewer or more levels of hotness can also be used.

The term "high-density NAND" as used in this disclosure refers to a NAND with cells which can program multiple bits per cell, including: Multi-Level Cell (MLC) NAND (2 bits per cell); Triple-Level Cell (TLC) NAND (3 bits per cell); and Quad-Level (QLC) NAND (4 bits per cell).

The term "gradual page-wise programming" refers to the method described below in relation to FIG. 4, wherein an update to existing data in an original wordline is programmed into a next available ordered page of the original wordline.

Exemplary Operation of a Storage System in the Prior Art

FIG. 1 illustrates an exemplary environment which facilitates operation of a storage system, in accordance with the prior art. Environment 100 can depict a storage server 100, which can pair a high-density SSD (such as a QLC-based SSD) with a fast cache (with a high endurance). For example, storage server 100 can include: CPU sockets 110; Dynamic Random Access Memory (DRAMs) 112, 114, 116, and 118; a fast cache 120; a fast cache 122; a network interface card (NIC) 124; and high-density SSDs 130, 132, 134, and 136.

While the fast cache (e.g., 120 and 122) may have characteristics such as a high throughput, a low latency, and a high endurance, they can also incur a high financial cost. As a result, the fast cache is generally deployed only in small numbers as compared to the high-density NAND. The high-density NAND can provide a large capacity and serve as the main data storage. By pairing the high-density NAND (e.g., 130-132) with the fast cache (e.g., 120 and 122), storage server 100 can mitigate the high-density NAND's limitation on endurance and throughput by offloading tasks to the fast cache.

However, deploying the fast cache with the high-density NAND can result in several drawbacks. First, while the fast cache can merge incoming I/O data into a larger size, the frequent update of hot data can still trigger a non-trivial garbage collection. Second, the high-density NAND can result in an increased storage capacity for a single SSD. Given a similar usage pace of this increased capacity, an increased idle capacity may result from the mismatch between the amount of data capable of being processed simultaneously by the small numbers of fast cache and the ever-increasing numbers of high-density NAND. Third, high-density NAND may involve the inherent constraint of a high raw error rate, where the latency involved in a random access operation may not be fully addressable by the fast cache.

Exemplary Diagrams for Programming a NAND Cell

The embodiments described herein address the problems described in relation to the prior art system of FIG. 1 by programming the bits of a NAND cell in a page-wise manner. Using a TLC NAND cell (with three bits per cell) as an example, the system can program all three bits of a NAND cell together (as shown in FIG. 2A) or can program the three bits of a NAND cell on a page-by-page basis (as shown in FIG. 2B).

Figure 2A:
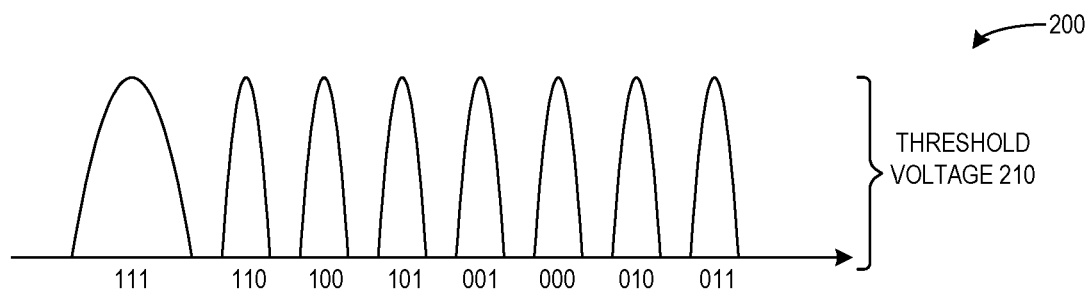
FIG. 2A illustrates an exemplary diagram for programming a TLC cell with eight levels of threshold voltage, in accordance with an embodiment of the present application.

FIG. 2A illustrates an exemplary diagram 200 for programming a TLC cell with eight levels of threshold voltage, in accordance with an embodiment of the present application. In diagram 100, a threshold voltage 210 can include eight different levels, as indicated by the eight values of: 111; 110; 100; 101; 001; 000; 010; and 011.

Figure 2B:
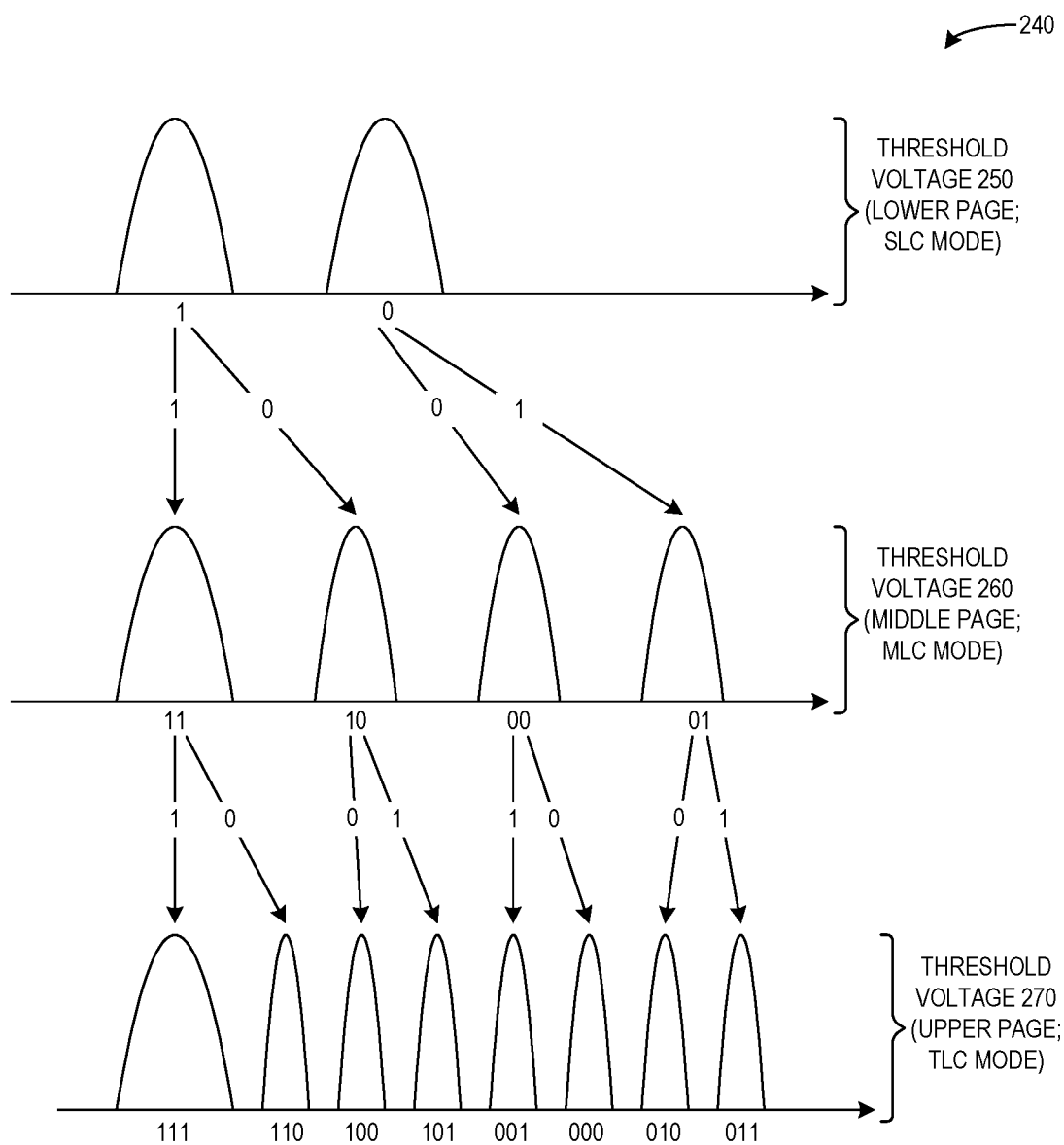
FIG. 2B illustrates an exemplary diagram for programming a TLC cell on a gradual page-wise basis, in three separate levels, in accordance with an embodiment of the present application.

FIG. 2B illustrates an exemplary diagram 240 for programming a TLC cell on a gradual page-wise basis, in three separate levels, in accordance with an embodiment of the present application. In the described embodiments, the system can divide a NAND cell into three pages, e.g., a lower page, a middle page, and an upper page. The system can program each cell by first programming the lower page (operating in the SLC mode), by subsequently programming the middle mage (operating in the MLC mode), and finally by programming the upper page (operating in the QLC mode).

For example, the system can program the lower page in an SLC mode by applying a threshold voltage 250 to this lower page, as indicated by the two values of: 1 and 0. Subsequently, the system can program the middle page in an MLC mode by applying a threshold voltage 260 to this middle page, as indicated by the four values of: 11; 10; 00; and 01. Finally, the system can program the upper page in a TLC mode by applying a threshold voltage 270 to this upper page, as indicated by the eight values of: 111; 110; 100; 101; 001; 000; 010; and 011.

There is no limitation that the cells of a given wordline must be "fully" programmed into the highest density mode possible (e.g., the TLC mode as depicted herein) before the next wordline is programmed. That is, the system can place data in multiple lower/middle pages of a first wordline and can place subsequent data in other lower/middle pages of a different wordline before filling up the middle/upper pages in the first wordline, as described below in relation to FIGS. 3 and 4.

Exemplary NAND Block with Block-Level Overprovisioning

Figure 3:
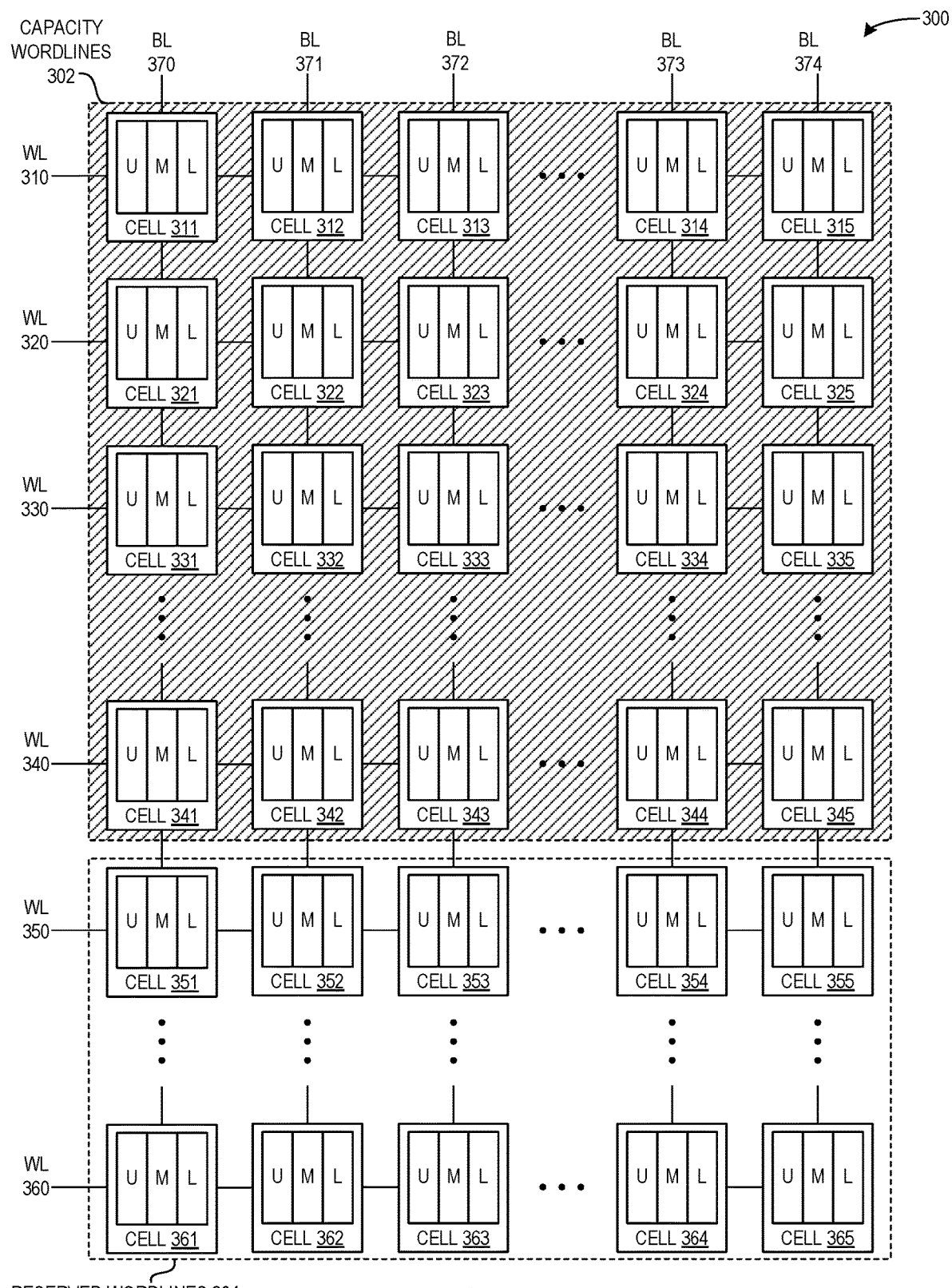
FIG. 3 illustrates an exemplary unit of a non-volatile memory, including block-level overprovisioning using capacity wordlines and reserved wordlines, in accordance with an embodiment of the present application.

FIG. 3 illustrates an exemplary unit 300 of a non-volatile memory, including block-level overprovisioning using capacity wordlines 302 and reserved wordlines 304, in accordance with an embodiment of the present application. Unit 300 can depict a single NAND block 300. In the described embodiments, the system can reconstruct the over-provisioning design. Rather than assigning certain free blocks for redundancy and over-provisioning, the system allocates the over-provisioning by assigning certain wordlines (WLs) as the redundant or free wordlines.

Thus, NAND block 300 can include capacity wordlines 302 and reserved wordlines 304. Capacity wordlines 302 (indicated by the area with the right-slanting diagonal lines) can include wordlines 310, 320, 330, and 340. Reserved wordlines 304 can include wordlines 350 and 360. A wordline can be coupled to a plurality of pages across a plurality of cells. For example, wordline 310 can include a plurality of bitlines (BLs) 370-374, where each cell corresponding to a bitline of wordline 310 can include an upper ("U"), middle ("M"), and lower ("L") page (or indicate a portion of an upper, middle, or lower page). For example, wordline 310 can include cells 311-315, and cell 311 can include an U, M, and L page. Wordline 310 can thus include, comprise, consist of, or be coupled to three pages (in this TLC example), across cells 311-315 (e.g., across bitlines 370-374).

As described above, each wordline can be flexibly programmed in a different mode (e.g., SLC, MLC, or TLC), based on many factors, including but not limited to: the amount of data being written; a frequency of access or updating; and a classified "hotness" category for the data. As part of the flexible programming, given an original version of data stored in a lower page of an original, the system can write updated data to a next available ordered page of the original wordline. By writing updated versions of existing data to the same wordline or block, the system can improve its garbage collection process by creating fewer "holes" in the data, as described below in relation to FIG. 4.

Furthermore, when the system writes data to the lower or middle page (i.e., in the page-wise manner described herein and as indicated in FIG. 2B), the system can achieve a shorter write latency as compared to programming all the pages together (as indicated in FIG. 2A).

Gradual Page-Wise Programming and Data Placement/Movement: Version Updates and Garbage Collection NAND flash may experience issues relating to both data retention and endurance. Data retention is the ability to retain stored information over time. Data retention issues result from the NAND cell leaking charge on a gradual basis. This can cause the threshold voltage to shift, and can also result in a decrease in the data quality. Endurance refers to the lifespan of the physical storage media of NAND flash. Each NAND cell has a limited number of program/erase cycles which it can withstand before the storage media is no longer reliable, i.e., cannot provide consistent storage over time, resulting in the data retention issue.

Figure 4:
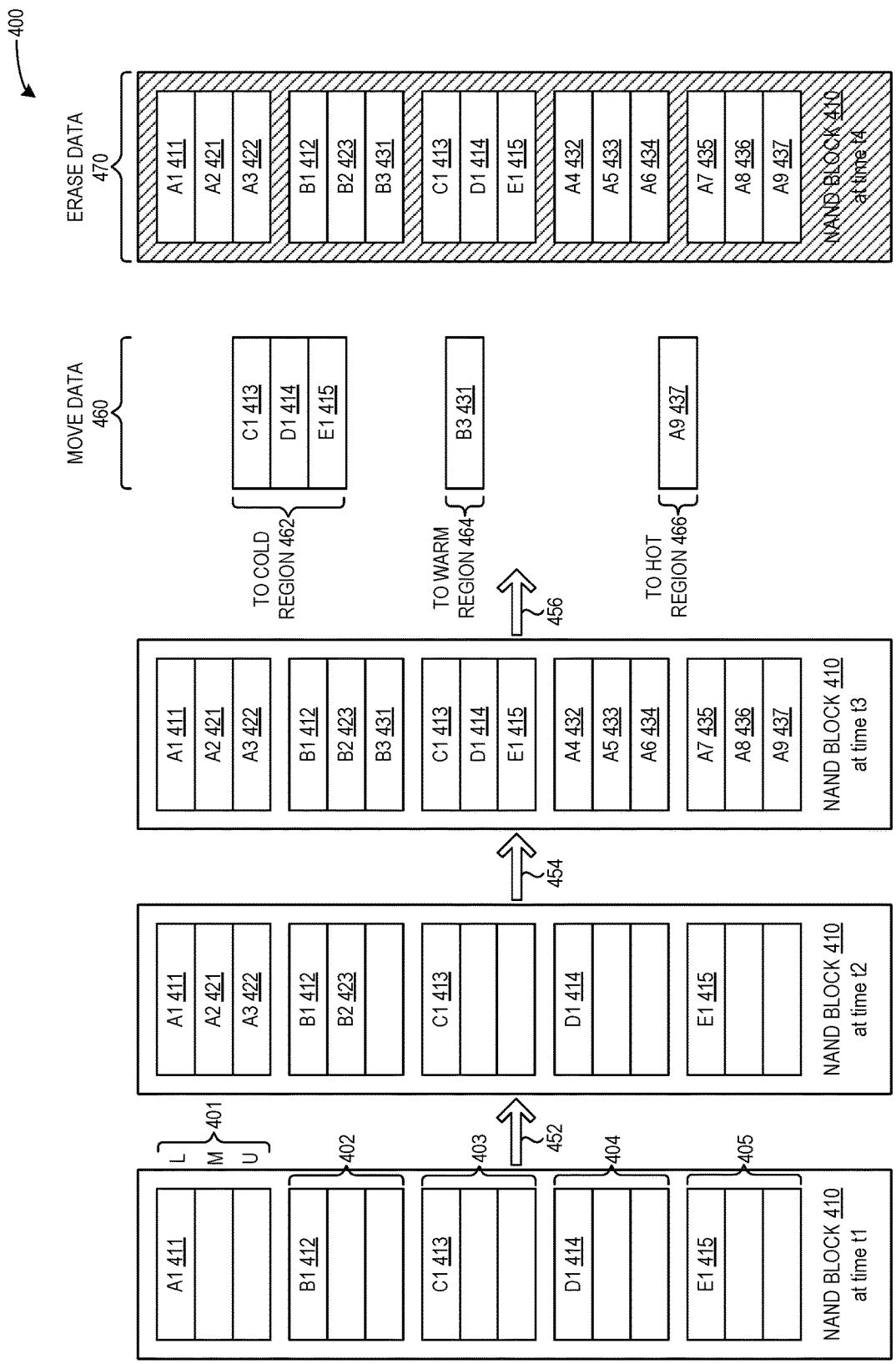
FIG. 4 illustrates an exemplary page-wise programming and data placement/movement, including version updates and a garbage collection process, in accordance with an embodiment of the present application.

FIG. 4 illustrates an exemplary page-wise programming 400 and data placement/movement, including version updates and a garbage collection process, in accordance with an embodiment of the present application. A NAND block 410 over several different times is depicted in FIG. 4. NAND block 410 is depicted with several sub-blocks, each with a group representing data written to three pages. Each sub-block can thus correspond to one wordline, where ach wordline can be coupled to a plurality of pages (e.g., lower, middle, and upper) across multiple cells. For example, the uppermost depicted sub-block in NAND block 410 at time t1 can correspond to a wordline 401, which is coupled to or is depicted as including a lower ("L"), middle ("M"), and upper ("U") page. In each sub-block or wordline 401, 402, 403, 404, and 405, the multiple pages can be arranged in order of L, M, and U in a downward direction, i.e., the pages are ordered by an increasing number of programmable bits per cell.

NAND block 410 at time t1 can include a first or an initial version of data, which is written to a lower page of each of the sub-blocks of NAND block 410. That is: A1 411 is written to a lower page corresponding to wordline 401; B1 412 is written to a lower page corresponding to a next available wordline 402; C1 413 is written to a lower page corresponding to a next available wordline 403; D1 414 is written to a lower page corresponding to a next available wordline 404; and E1 415 is written to a lower page corresponding to a next available wordline 405. The sub-blocks and pages corresponding to wordlines 401-405 are thus depicted as programmed in the SLC mode in NAND block 410 at time t1.

After some period of time, based on a communication 452, the system may receive more incoming data to be stored in NAND block 410 (e.g., A2 421, A3 422, and B2 423). The system determines whether the received data is an updated version of existing data stored in the non-volatile memory (i.e., the data stored as A1 411 and B1 412, as depicted above at time t1). If the received data is an updated version, the system can write the updated version to a next available ordered page corresponding to an existing wordline in which the existing data is stored.

If the received data is not an updated version, the system can write the received data to a first ordered or lower page of a plurality of pages corresponding to a next available wordline (not shown). In some embodiments, the system can also write the received data to a next available ordered page (e.g., a middle or an upper page) of a next available wordline, even if the received data is not an update to the existing data. This may occur in cases where the original existing data has been stored in the lower page for greater than a predetermined period of time (i.e., has not received an updated version or been marked for recycling for the predetermined period of time). Thus, data placement can be based on a frequency of access, as described below.

NAND block 410 at time t2 depicts this data placement. The system receives A2 421 and determines that A2 421 is an updated version of existing data (A1 411), and thus writes A2 421 to the next available ordered page (the middle page) of the existing wordline (401) in which the existing data (A1 411) is stored. The sub-block and pages corresponding to wordline 401 are thus programmed in the MLC mode (not shown). The system also receives A3 422 and determines that A3 422 is an updated version of existing data (A2 421), and thus writes A3 422 to the next available ordered page (the upper page) of the existing wordline (401) in which the existing data (A2 421) is stored. The sub-block and pages corresponding to wordline 401 are thus depicted as programmed in the TLC mode.

Furthermore, the system determines that B2 423 is an updated version of existing data (B1 412), and thus writes B2 423 to the next available ordered page (the middle page) of the existing wordline (402) in which the existing data (B1 412) is stored. The sub-block and pages corresponding to wordline 402 are thus depicted as programmed in the MLC mode.

Subsequently, based on a communication 454, the system may receive more incoming data to be stored in NAND block 410 (e.g., B3 431, A4 432, A5 433, A6 434, A7 435, A8 436, and A9 437). The system can also perform internal data movement to efficiently fill certain wordlines based on, e.g., an access frequency or a hotness. NAND block 410 at time t3 depicts this data placement. For example, after not receiving an updated version of C1 413, D1 414, and E1 415 within a predetermined period of time, the system can copy D1 414 to the middle page of wordline 403 in which C1 413 is stored, and can further copy E1 415 to the upper page of wordline 403 in which C1 413 and D1 414 are stored.

Moreover, as part of writing the received incoming data, the system can write A4 432 to the next available ordered page (in this case, the lower page) of a next available wordline (404). The system can write A5 433 to the next available ordered page (the middle page) of the existing wordline (404) in which A4 432 is stored. The system proceeds in this manner, by writing: A6 434 to the next available ordered page (upper page) of the existing wordline (404) in which A5 433 is stored; A7 435 to the next available ordered page (in this case, the lower page) of a next available wordline (405); A8 436 to the next available ordered page (the middle page) of the existing wordline (405) in which A7 435 is stored; and A9 437 to the next available ordered page (upper page) of the existing wordline (405) in which A8 436 is stored.

Subsequently, the system can detect a condition which triggers a garbage collection process 456. The system can identify a set of pages which comprise the latest or most recent versions of data stored in NAND block 410, e.g., A9 437, B3 431, C1 413, D1 414, and E1 415 ("the most recent versions" of the data). The system can classify each of these pages into a category of "hotness" based on an access frequency of a respective page. The categories are classifications which can include: a hot classification; a warm classification; and a cold classification. The system can classify a data page as hot if it is accessed at a frequency which is greater than a first predetermined value. The system can classify a data page as warm if it is accessed at a frequency which is less than the first predetermined value and greater than a second predetermined value. The system can classify a data page as cold if it is accessed at a frequency which is less than the second predetermined value. The first and second predetermined values may be set by a user or to a default system configuration value. The access frequency can indicate various factors, including, but not limited to: the number of times that data has been accessed over a predetermined period of time or interval; a length of time since the most recent access; and a number of overall times that the data has been accessed since the data was first written.

After classifying the data based on its hotness (i.e., various factors for access frequency), the system can write a classified page into a similarly classified region of the non-volatile memory. That is, the system can assign various regions of the SSD as hot, warm, or cold regions which store, respectively, data classified as hot, warm, or cold. During the garbage collection process or other internal data movement procedure, the system can move data to various regions based on the classification of the data (via a move data 460 function). For example, in FIG. 4, the system can classify C1 413, D1 414, and E1 415 as cold data, and write these pages to a cold region 462 of the non-volatile memory. The system can classify B3 431 as warm data, and write this page to a warm region 464 of the non-volatile memory. The system can classify A9 437 as hot data, and can write this page to a hot region 466 of the non-volatile memory. Subsequently, after copying out the valid, classified, and most recent versions of the data, the system can erase NAND block 410 at time t4.

Thus, by writing updated versions of data in a page-wise manner to a same wordline as existing data, classifying data based on access frequency, and moving data internally based on the classification to a similarly classified region of the non-volatile memory, the embodiments described herein can result in a reduced write amplification and reduced data movement during internal writes (such as during a garbage collection process).

Another improvement can also result from the consolidation of data, both internally within a block and during a recycling or garbage collection process. The multiple versions of the same page (e.g., all the versions of data Ax in NAND block 410 at time t3) may have a strong correlation with each other, in that each version may be strongly similar to another version, or that only minor differences may exist between the various versions. By consolidating the data, the system can improve the error correction process as well as the data recovery process by analyzing the common portion. This can result in fixing or improving uncorrectable errors, which can result in enhancing the quality and consistency of the data, especially given noisy channels in high-density flash.

Exemplary Channels in a Drive with Drive-Level Overprovisioning

Figure 5:
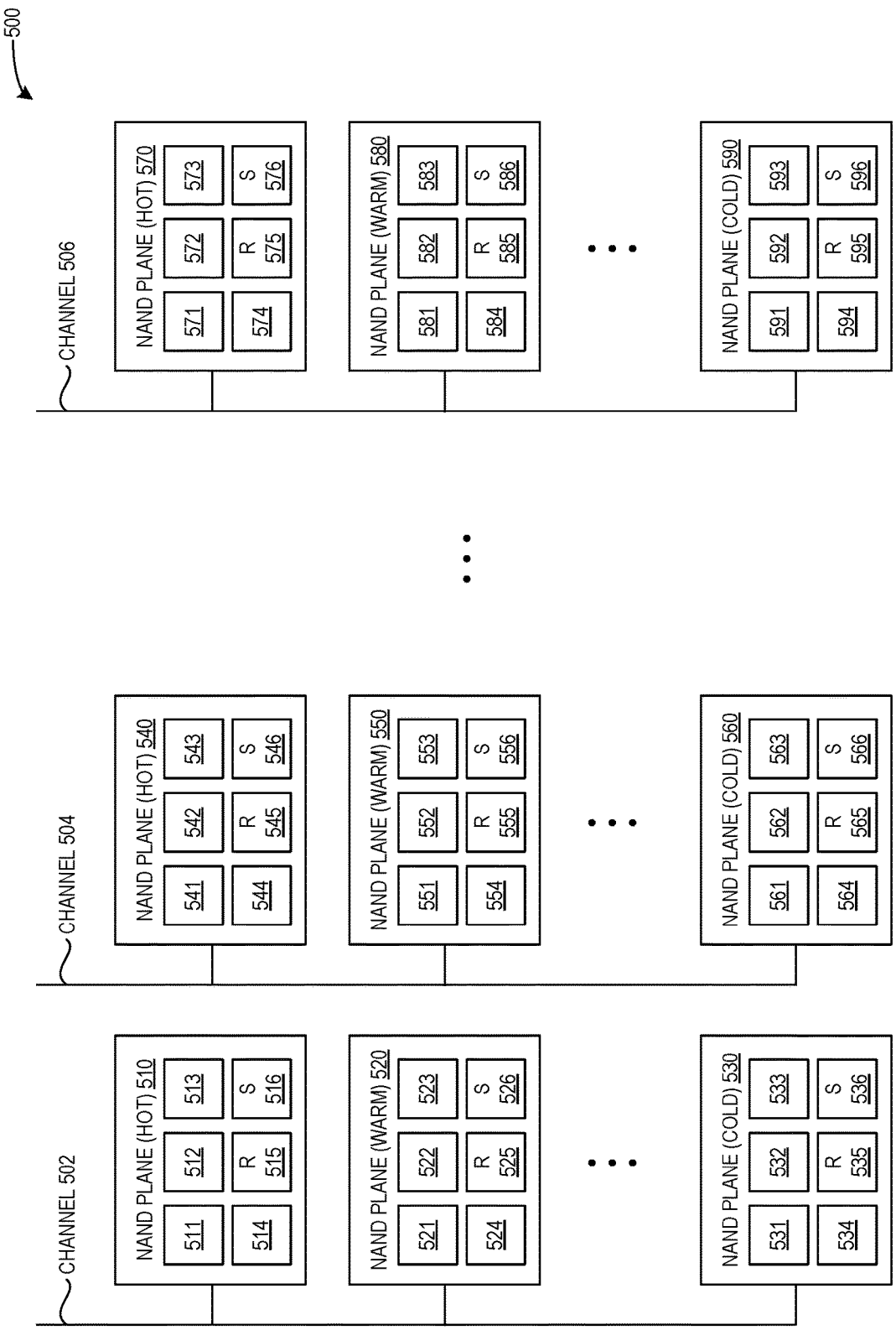
FIG. 5 illustrates an exemplary overprovisioning using channels in a drive, including drive-level overprovisioning using reserved bocks and spare blocks, in accordance with an embodiment of the present application.

As described above in relation to FIG. 3, the system can provide a first stage of overprovisioning by using reserved wordlines, which keeps the spare pages in the same NAND block. The system can also support a second stage of overprovisioning at the block level within a NAND plane. FIG. 5 illustrates an exemplary overprovisioning 500 using channels in a drive, including drive-level overprovisioning using reserved blocks and spare blocks, in accordance with an embodiment of the present application. FIG. 5 can depict a non-volatile memory with a plurality of channels 502, 504, and 506. A channel can include multiple NAND planes, and a particular NAND plane be assigned as a hot, warm, or cold region. The system can assign a plane as a region with a particular classification, which can be similar to the classification of data based on access frequency. For example: a page with a hot classification can be written to a hot region of the non-volatile memory; a page with a warm classification can be written to a warm region of the non-volatile memory; and a page with a cold classification can be written to a cold region of the non-volatile memory. These classifications are used only as examples. Other classifications, including more or fewer classifications, are also possible.

Channel 502 can be associated with NAND planes 510, 520, and 530. The system can assign NAND plane 510 as a hot region, NAND plane 520 as a warm region, and NAND plane 530 as a cold region. Similarly, channel 504 can be associated with a hot NAND plane 540, a warm NAND plane 550, and a cold NAND plane 560. Channel 506 can be associated with a hot NAND plane 570, a warm NAND plane 580, and a cold NAND plane 590. Thus, the hot, warm, and cold regions are spread across multiple channels. The system can also dynamically assign a plane as a hot, warm, or cold region based on the results of a garbage collection process, and further based on processing incoming I/O requests. This can result in non-fixed and dynamically changing boundaries for the hot, warm, and cold regions of the non-volatile memory.

Each plane can include multiple blocks, a least one reserved block, and at least one spare block. For example, NAND plane 510 can include: data blocks 511, 512, 513, and 514; a reserved block 515; and a spare block 516. The spare blocks are depicted with an "S," and the reserved blocks are depicted with an "R" in FIG. 5. The spare blocks can be exposed to the flash translation layer (FTL), which allows the system to use a spare block not only for redundancy, but also for overprovisioning (and bad block management). The system can also record the program/erase cycle of the spare block, and use this recorded information for wear-leveling purposes. It has been observed that a large percentage of spare blocks may not be used during the lifespan of an SSD. Thus, using spare blocks for overprovisioning in this manner can result in a more efficient storage system. At the same time, the reserved blocks can also be used for overprovisioning.

Thus, this second stage of drive-level overprovisioning at the block level, along with the first stage of block-level overprovisioning at the page level, can result in an improved and more efficient storage system.

Exemplary Data Migration of Replicas to Archival Storage Based on Hotness Classifications/Regions In a distributed storage system with multiple replicas stored across different storage devices in the storage system, the embodiments described herein can further reduce overall costs by copying, based on predetermined thresholds, certain copies of cold or warm blocks to an archival storage with a lower cost than SSDs (e.g., a physical storage media such as an HDD or tape).

Figure 6:
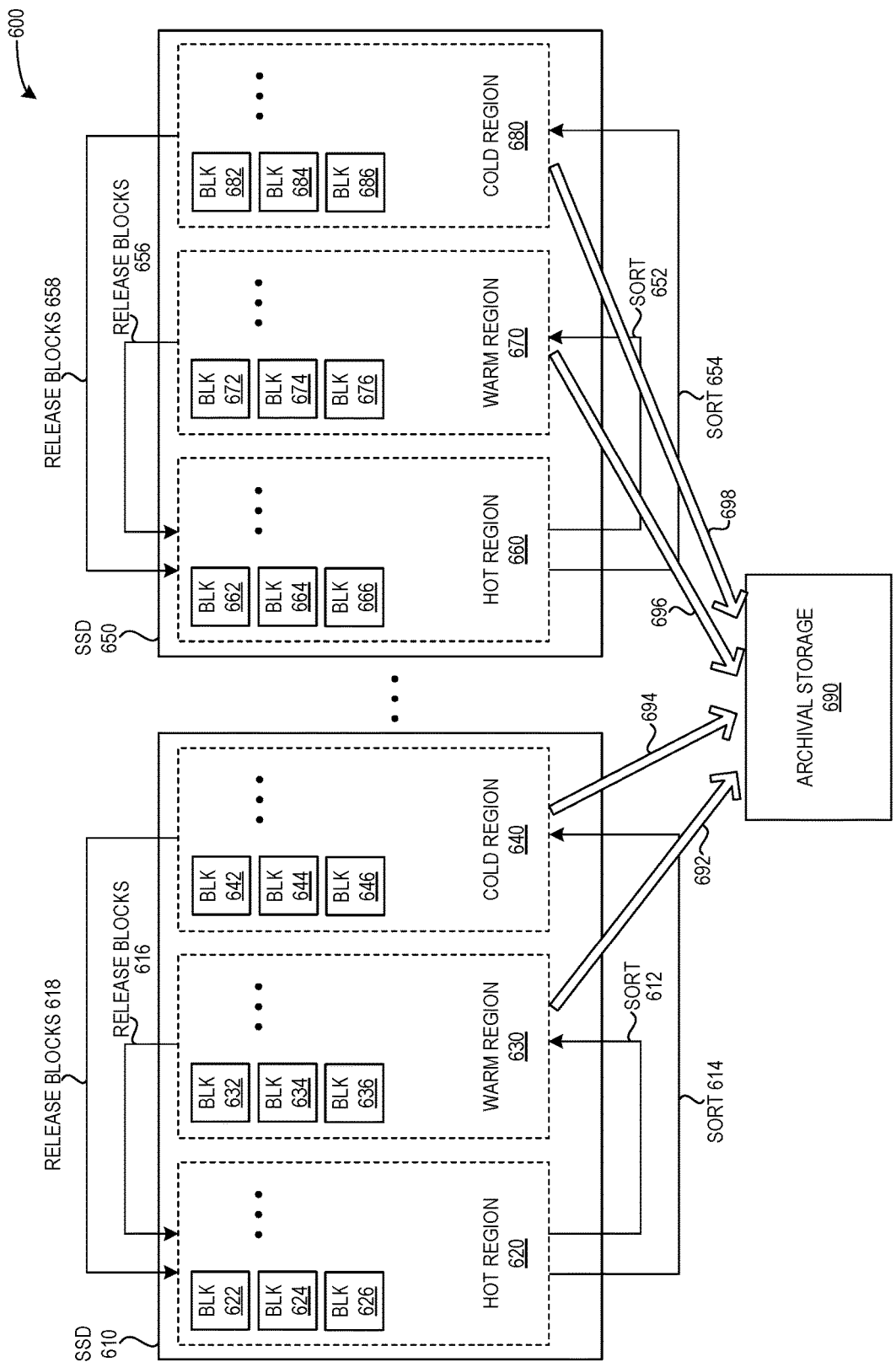
FIG. 6 illustrates an exemplary data migration to archival storage of replicas from classified regions of the non-volatile memory, in accordance with an embodiment of the present application.

FIG. 6 illustrates an exemplary data migration 600 to archival storage of replicas from classified regions of the non-volatile memory, in accordance with an embodiment of the present application. FIG. 6 depicts SSDs 610 and 650, where each SSD includes at least a hot region, a warm region, and a cold region. For example, SSD 610 can include: a hot region 620 with blocks 622, 624, and 626; a warm region 630 with blocks 632, 634, and 636; and a cold region 640 with blocks 642, 644, and 646. Similarly, SSD 650 can include: a hot region 660 with blocks 662, 664, and 666; a warm region 670 with blocks 672, 674, and 676; and a cold region 680 with blocks 682, 684, and 686.

During operation, the system can determine that a first replica (or a block of a first replica) in a warm region ("a warm block") meets a first predetermined threshold for being moved to an archival storage 690, and move the warm block to archival storage 690. The system can also determine that a second replica (or a block of a second replica) in a cold region ("a cold block") meets a second predetermined threshold for being moved to archival storage 690, and move the cold block to archival storage 690. The system can move one or more warm blocks (or replicas) and one or more cold blocks (or replicas), based on various predetermined thresholds. One such predetermined threshold may be whether a replica has been stored in a given region for more than a certain period of time without being updated, i.e., a period of time since a last update to the replica in the given region. Another predetermined threshold may be a rule for values configured by the system or a user, such as: move one of three copies from a warm region at a first given time or after a first predetermined period of time; and move two of three copies from a cold region at a second given time or after a second predetermined period of time.

Once the replicas are moved to the archival storage, the system can release the blocks previously occupied by those replicas. The system can then use those released blocks to store incoming data and classify the data based on hotness or access frequency (as described above in relation to FIG. 4). The system can also gather or accumulate the data during a garbage collection process and write the classified data to the similarly classified regions (as described above for the internal data movement in relation to FIG. 4).

For example, the system can determine that block 636 of warm region 630 is a warm block which meets a first predetermined threshold for being moved to archival storage 690, and can move the data stored in warm block 636 to archival storage 690 (via a communication 692). The system can then release block 636 for usage in another region or to store incoming data (via a release blocks 616). The system can also determine that blocks 644 and 646 of cold region 640 are cold blocks which meet a second predetermined threshold for being moved to archival storage 690, and can move the data stored in cold blocks 644 and 646 to archival storage 690 (via a communication 694). The system can then release blocks 644 and 646 for usage in another region or to store incoming data (via a release blocks 618). As the system performs any internal data movement (e.g., based on a recycling or garbage collection process) or processes any incoming I/O requests, the system can continue to classify the data (e.g., in hot region 620), and write the classified data to warm region 630 or cold region 640 as needed (via, respectively, a sort 612 operation and a sort 614 operation).

As another example, the system can determine that block 674 of warm region 670 is a warm block which meets a first predetermined threshold for being moved to archival storage 690, and can move the data stored in warm block 674 to archival storage 690 (via a communication 696). The system can then release block 674 for usage in another region or to store incoming data (via a release blocks 656). The system can also determine that blocks 682 and 686 of cold region 680 are cold blocks which meet a second predetermined threshold for being moved to archival storage 690, and can move the data stored in cold blocks 682 and 686 to archival storage 690 (via a communication 698). The system can then release blocks 682 and 686 for usage in another region or to store incoming data (via a release blocks 658). As the system performs any internal data movement (e.g., based on a recycling or garbage collection process) or processes any incoming I/O requests, the system can continue to classify the data (e.g., in hot region 660), and write the classified data to warm region 670 or cold region 670 as needed (via, respectively, a sort 652 operation and a sort 654 operation).

The data movement depicted in FIG. 6 can be referred to as a "copy migration," which refers to migrating (e.g., moving, copying, or writing) replicas to an archival storage based on certain predetermined thresholds. As described above, the hot, warm, and cold regions of the non-volatile memory are not fixed, and can be dynamically and flexibly changed based on various factors. The factors can include, but are not limited to: an amount of time that a most recent version has been stored in a same block as compared to a predetermined value; a predetermined amount of time since an updated version of the data has been written to the same or a different wordline in a same block; a number of copies in a hot, warm, or cold region exceeding a predetermined threshold number; a size of the region; a calculated weight assigned to a given region based on the access frequency of the data stored in the given region; and any value based on a historical and monitored characteristic of the data in a region or of the region itself.

Method for Facilitating Operation of a Non-Volatile Memory

Figure 7A:
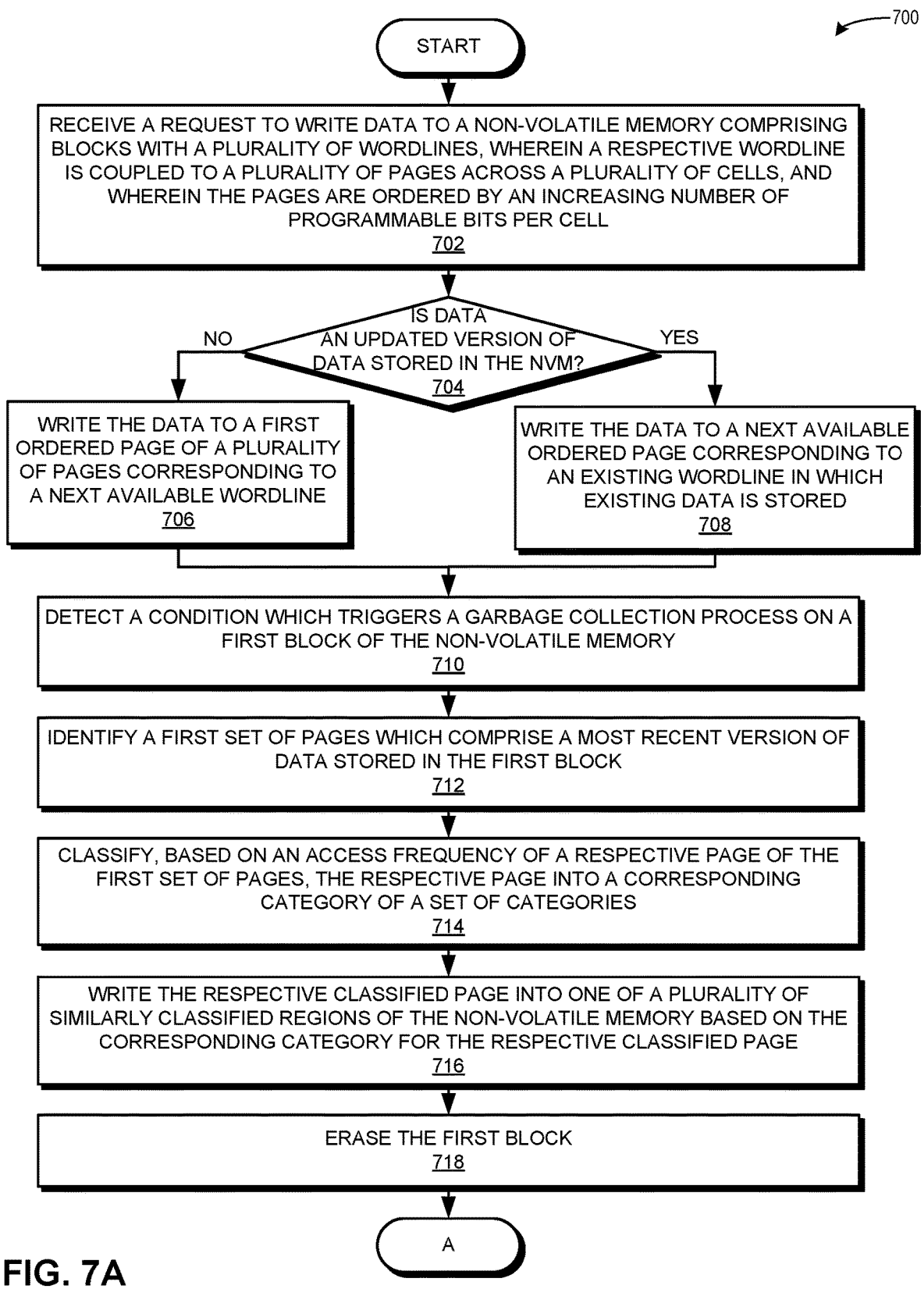
FIG. 7A presents a flowchart illustrating a method for facilitating operation of a non-volatile memory, in accordance with an embodiment of the present application.

FIG. 7A presents a flowchart 700 illustrating a method for facilitating operation of a non-volatile memory, in accordance with an embodiment of the present application. During operation, the system receives a request to write data to a non-volatile memory comprising blocks with a plurality of wordlines, wherein a respective wordline is coupled to a plurality of pages across a plurality of cells, and wherein the pages are ordered by an increasing number of programmable bits per cell (operation 702). If the data is not an updated version of data stored in the non-volatile memory (decision 704), the system writes the data to a first ordered page of a plurality of pages corresponding to a next available wordline (operation 706). If the data is an updated version of data stored in the non-volatile memory (decision 704), the system writes the data to a next available ordered page corresponding to an existing wordline in which the existing data is stored (operation 708).

The system detects a condition which triggers a garbage collection process on a first block of the non-volatile memory (operation 710). The system identifies a first set of pages which comprise a most recent version of data stored in the first block (operation 712). The system classifies, based on an access frequency of a respective page of the first set of pages, the respective page into a corresponding category of a set of categories (operation 714). The system writes the respective classified page into one of a plurality of similarly classified regions of the non-volatile memory based on the corresponding category for the respective classified page (operation 716). The system erases the first block (operation 718), and the operation continues at Label A of FIG. 7B.

Figure 7B:
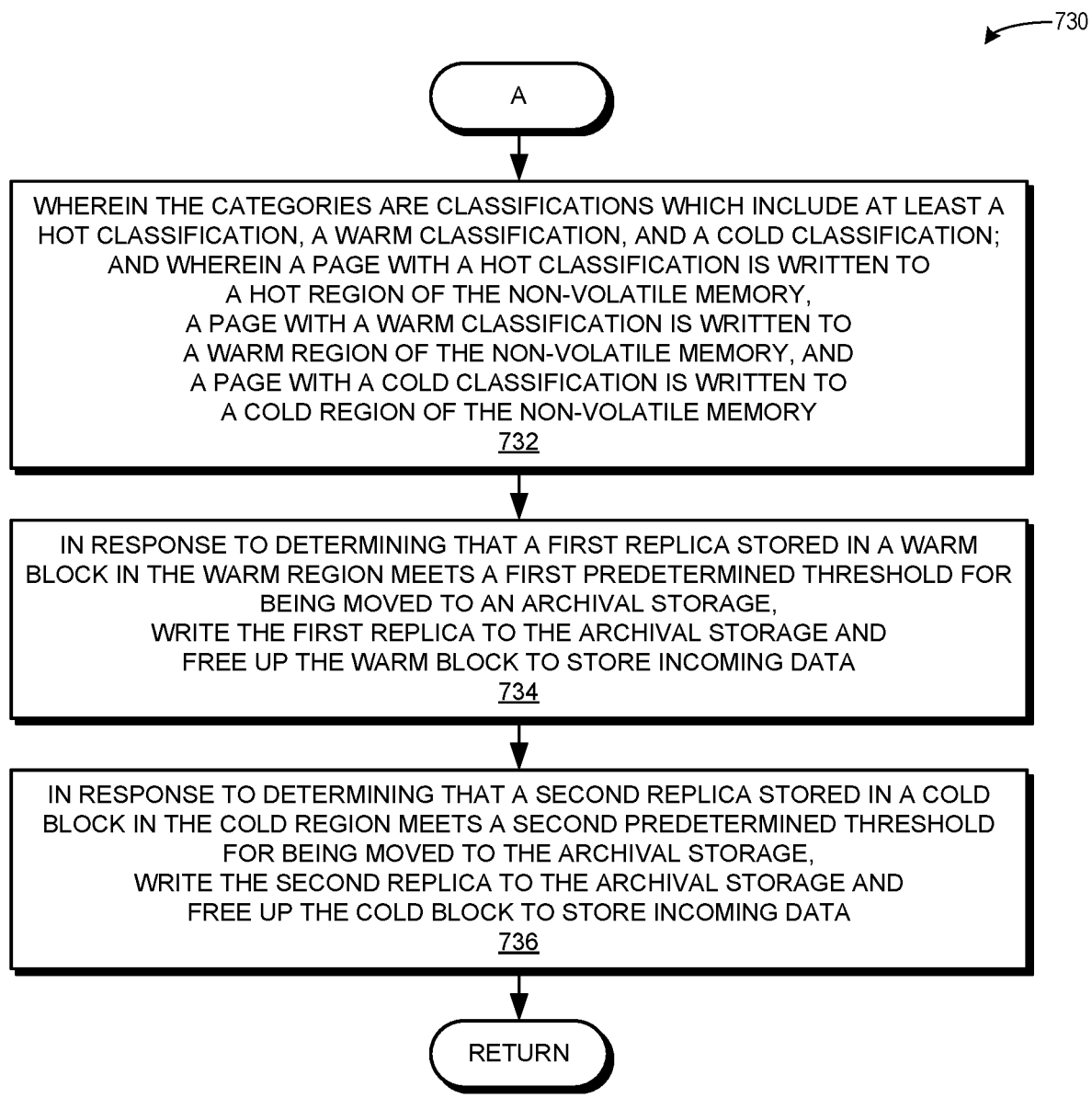
FIG. 7B presents a flowchart illustrating a method for facilitating operation of a non-volatile memory, in accordance with an embodiment of the present application.

FIG. 7B presents a flowchart 730 illustrating a method for facilitating operation of a non-volatile memory, in accordance with an embodiment of the present application. The categories are classifications which include at least a hot classification, a warm classification, and a cold classification; and wherein a page with a hot classification is written to a hot region of the non-volatile memory, wherein a page with a warm classification is written to a warm region of the non-volatile memory, and wherein a page with a cold classification is written to a cold region of the non-volatile memory (operation 732). In response to determining that a first replica stored in a warm block in the warm region meets a first predetermined threshold for being moved to an archival storage, the system writes the first replica to the archival storage and frees up the warm block to store incoming data (operation 734). In response to determining that a second replica stored in a cold block in the cold region meets a second predetermined threshold for being moved to the archival storage, the system writes the second replica to the archival storage and frees up the cold block to store incoming data (operation 736).

Exemplary Computer System and Apparatus

Figure 8:
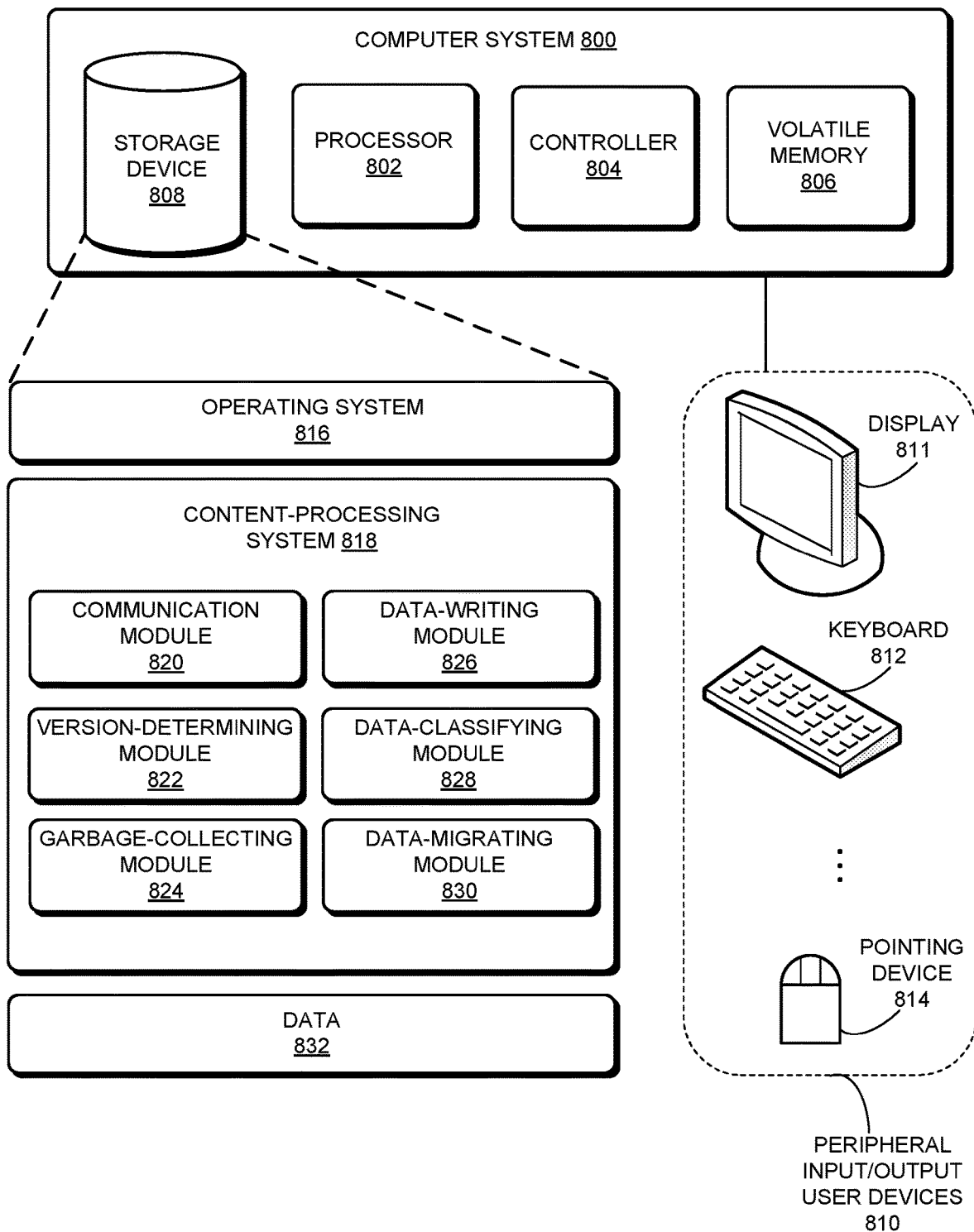
FIG. 8 illustrates an exemplary computer system that facilitates operation of a non-volatile memory, in accordance with an embodiment of the present application.

FIG. 8 illustrates an exemplary computer system 800 that facilitates operation of a non-volatile memory, in accordance with an embodiment of the present application. Computer system 800 can include a processor 802, a controller 804, a volatile memory 806, and a storage device 808. Controller 804 can be part of computer system 800 and can be further associated with a storage drive (not shown) which is associated with or coupled to computer system 800. Volatile memory 806 can include, e.g., random access memory (RAM), that serves as a managed memory, and can be used to store one or more memory pools. Storage device 808 can include persistent storage which can be managed or accessed via processor 802 (or controller 804). Furthermore, computer system 800 can be coupled to peripheral input/output (I/O) user devices 618, e.g., a display device 811, a keyboard 812, and a pointing device 814. Storage device 808 can store an operating system 816, a content-processing system 818, and data 832.

Content-processing system 818 can include instructions, which when executed by computer system 800, can cause computer system 800 or processor 802 to perform methods and/or processes described in this disclosure. Specifically, content-processing system 818 can include instructions for receiving and transmitting data packets, including data to be read or written and an input/output (I/O) request (e.g., a read request or a write request) (communication module 820).

Content-processing system 818 can further include instructions for receiving a request to write data to a non-volatile memory comprising blocks with a plurality of wordlines, wherein a respective wordline is coupled to a plurality of pages across a plurality of cells, and wherein the pages are ordered by an increasing number of programmable bits per cell (communication module 820). Content-processing system 818 can include instructions for, in response to determining that the data is not an updated version of data stored in the non-volatile memory (version-determining module 822), writing the data to a first ordered page of a plurality of pages corresponding to a next available wordline (data-writing module 826). Content-processing system 818 can include instructions for, in response to determining that the data is an updated version of existing data stored in the non-volatile memory (version-determining module 822), writing the data to a next available ordered page corresponding to an existing wordline in which the existing data is stored (data-writing module 826).

Content-processing system 818 can additionally include instructions for detecting a condition which triggers a garbage collection process on a first block of the non-volatile memory (garbage-collecting module 824). Content-processing system 818 can include instructions for identifying a first set of pages which comprise a most recent version of data stored in the first block (garbage-collecting module 824). Content-processing system 818 can include instructions for classifying, based on an access frequency of a respective page of the first set of pages, the respective page into a corresponding category of a set of categories (data-classifying module 828). Content-processing system 818 can include instructions for writing the respective classified page into one of a plurality of similarly classified regions of the non-volatile memory based on the corresponding category for the respective classified page (data-writing module 826). Content-processing system 818 can include instructions for erasing the first block (garbage-collecting module 824).

Content-processing system 818 can further include instructions for, in response to determining that a first replica stored in a warm block in the warm region meets a first predetermined threshold for being moved to an archival storage (data-migrating module 830), writing the first replica to the archival storage and freeing up the warm block to store incoming data (data-migrating module 830). Content-processing system 818 can include instructions for, in response to determining that a second replica stored in a cold block in the cold region meets a second predetermined threshold for being moved to the archival storage (data-migrating module 830), writing the second replica to the archival storage and freeing up the cold block to store incoming data (data-migrating module 830).

Data 832 can include any data that is required as input or generated as output by the methods and/or processes described in this disclosure. Specifically, data 832 can store at least: data; a request; a read request; a write request; an input/output (I/O) request; data associated with a read request, a write request, or an I/O request; a logical block address (LBA); a physical block address (PBA); an indicator of a wordline, a page, or a cell, an indicator of a lower, middle, or upper page; a number of bits; a number of bits per cell; pages ordered by an increasing number of programmable bits per cell; an indicator of whether data is an updated version of existing data stored in the non-volatile memory; a condition which triggers garbage collection; a first set of pages which comprise a most recent version of data; an access frequency; a category; a classified region; a hot classification; a warm classification; a cold classification; an indicator of a hot region, a warm region, or a cold region; an indicator of a channel; an indicator of a reserved wordline, a spare block, or a reserved block; a boundary for regions of the non-volatile memory; a non-fixed and dynamic boundary; a predetermined threshold for data to be moved; a replica; an indicator of a wordline operating in an SLC, MLC, TLC, or QLC mode; and a predetermined period of time, time interval, or other measure or unit of time.

Figure 9:
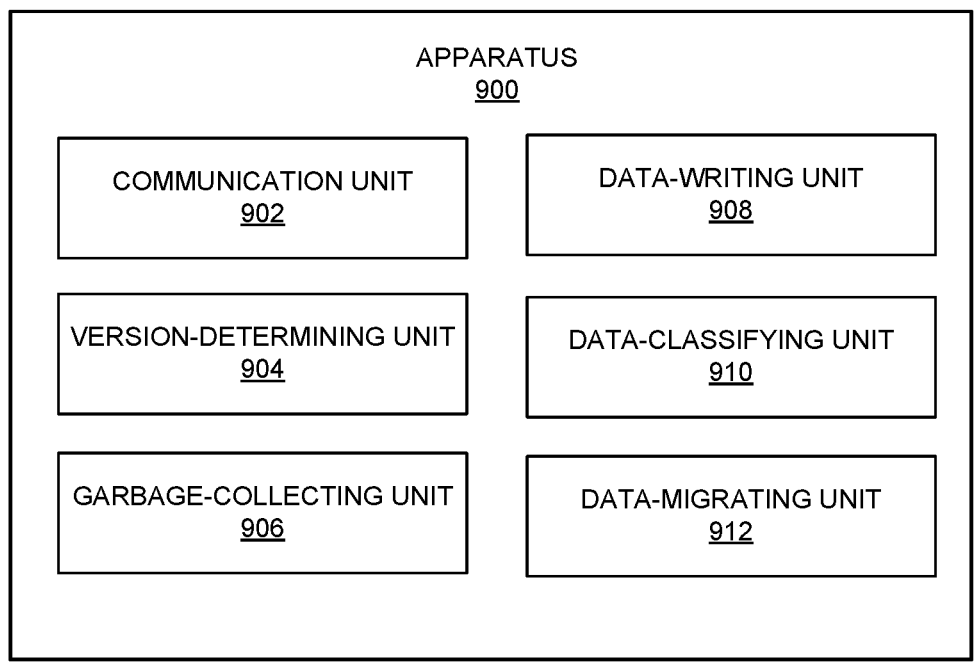
FIG. 9 illustrates an exemplary apparatus that facilitates operation of a non-volatile memory, in accordance with an embodiment of the present application.

FIG. 9 illustrates an exemplary apparatus 900 that facilitates operation of a non-volatile memory, in accordance with an embodiment of the present application. Apparatus 900 can comprise a plurality of units or apparatuses which may communicate with one another via a wired, wireless, quantum light, or electrical communication channel. Apparatus 900 may be realized using one or more integrated circuits, and may include fewer or more units or apparatuses than those shown in FIG. 9. Further, apparatus 900 may be integrated in a computer system, or realized as a separate device or devices capable of communicating with other computer systems and/or devices. Specifically, apparatus 900 can comprise modules or units 902-910 which are configured to perform functions or operations similar to modules 820-830 of computer system 800 of FIG. 8, including: a communication unit 902; a version-determining unit 904; a garbage-collecting unit 906; a data-writing unit 908; a data-classifying unit 910; and a drive-migrating unit 912.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method, comprising:
receiving a request to write data to a non-volatile memory comprising blocks with a plurality of wordlines, wherein a respective wordline is coupled to a plurality of pages across a plurality of cells, and wherein the pages are ordered by an increasing number of programmable bits per cell;
in response to determining that the data is not an updated version of existing data stored in the non-volatile memory, writing the data to a first ordered page of a plurality of pages corresponding to a next available wordline; and
in response to determining that the data is an updated version of existing data stored in the non-volatile memory, writing the data to a next available ordered page corresponding to an existing wordline in which the existing data is stored.

2. The method of claim 1, further comprising:
detecting a condition which triggers a garbage collection process on a first block of the non-volatile memory;
identifying a first set of pages which comprise a most recent version of data stored in the first block;
classifying, based on an access frequency of a respective page of the first set of pages, the respective page into a corresponding category of a set of categories;
writing the respective classified page into one of a plurality of similarly classified regions of the non-volatile memory based on the corresponding category for the respective classified page; and
erasing the first block.

3. The method of claim 2,
wherein the categories are classifications which include at least a hot classification, a warm classification, and a cold classification; and
wherein a page with a hot classification is written to a hot region of the non-volatile memory,
wherein a page with a warm classification is written to a warm region of the non-volatile memory, and
wherein a page with a cold classification is written to a cold region of the non-volatile memory.

4. The method of claim 3, further comprising:
dynamically assigning a plane of the non-volatile memory as a hot, warm, or cold region based on the garbage collection process and further based on processing I/O requests, to obtain non-fixed and dynamically changing boundaries for the hot, warm, and cold regions of the non-volatile memory.

5. The method of claim 3, wherein the data is written as multiple replicas in a distributed storage system, and wherein the method further comprises:
in response to determining that a first replica stored in a warm block in the warm region meets a first predetermined threshold for being moved to an archival storage, writing the first replica to the archival storage and freeing up the warm block to store incoming data; and
in response to determining that a second replica stored in a cold block in the cold region meets a second predetermined threshold for being moved to the archival storage, writing the second replica to the archival storage and freeing up the cold block to store incoming data.

6. The method of claim 1,
wherein the non-volatile memory comprises a plurality of channels,
wherein a respective channel comprises multiple planes, and
wherein a respective plane is assigned as a hot, warm, or cold region.

7. The method of claim 6,
wherein the respective plane includes multiple blocks, at least one reserved block, and at least one spare block,
wherein the at least one reserved block is used for over-provisioning, and
wherein the at least one spare block is used for bad block management.

8. The method of claim 1,
wherein the next available wordline is in a first area or a second area of a block in the non-volatile memory, and
wherein the first area is assigned as a nominal capacity region of the block and the second area is assigned as a reserved region of the block.

9. The method of claim 1,
wherein when the respective wordline stores data only in a first ordered page, the respective wordline operates in an SLC mode;
wherein when the respective wordline stores data only in the first ordered page and a second ordered page of the respective wordline, the respective wordline operates in an MLC mode;
wherein when the respective wordline stores data only in the first ordered page, the second ordered page, and a third ordered page of the respective wordline, the respective wordline operates in a TLC mode; and
wherein when the respective wordline stores data only in the first ordered page, the second ordered page, the third ordered page, and a fourth ordered page of the respective wordline, the respective wordline operates in a QLC mode.

10. A computer system, comprising:
a processor; and
a memory coupled to the processor and storing instructions which, when executed by the processor cause the processor to perform a method, the method comprising:
receiving a request to write data to a non-volatile memory comprising blocks with a plurality of wordlines, wherein a respective wordline is coupled to a plurality of pages across a plurality of cells, and wherein the pages are ordered by an increasing number of programmable bits per cell;
in response to determining that the data is not an updated version of existing data stored in the non-volatile memory, writing the data to a first ordered page of a plurality of pages corresponding to a next available wordline; and
in response to determining that the data is an updated version of existing data stored in the non-volatile memory, writing the data to a next available ordered page corresponding to an existing wordline in which the existing data is stored.

11. The computer system of claim 10, wherein the method further comprises:
detecting a condition which triggers a garbage collection process on a first block of the non-volatile memory;
identifying a first set of pages which comprise a most recent version of data stored in the first block;
classifying, based on an access frequency of a respective page of the first set of pages, the respective page into a corresponding category of a set of categories;
writing the respective classified page into one of a plurality of similarly classified regions of the non-volatile memory based on the corresponding category for the respective classified page; and
erasing the first block.

12. The computer system of claim 11,
wherein the categories are classifications which include at least a hot classification, a warm classification, and a cold classification; and
wherein a page with a hot classification is written to a hot region of the non-volatile memory,
wherein a page with a warm classification is written to a warm region of the non-volatile memory, and
wherein a page with a cold classification is written to a cold region of the non-volatile memory.

13. The computer system of claim 12, wherein the method further comprises:
dynamically assigning a plane of the non-volatile memory as a hot, warm, or cold region based on the garbage collection process and further based on processing I/O requests, to obtain non-fixed and dynamically changing boundaries for the hot, warm, and cold regions of the non-volatile memory.

14. The computer system of claim 12, wherein the data is written as multiple replicas in a distributed storage system, and wherein the method further comprises:
in response to determining that a first replica stored in a warm block in the warm region meets a first predetermined threshold for being moved to an archival storage, writing the first replica to the archival storage and freeing up the warm block to store incoming data; and
in response to determining that a second replica stored in a cold block in the cold region meets a second predetermined threshold for being moved to the archival storage, writing the second replica to the archival storage and freeing up the cold block to store incoming data.

15. The computer system of claim 10,
wherein the non-volatile memory comprises a plurality of channels,
wherein a respective channel comprises multiple planes,
wherein a respective plane is assigned as a hot, warm, or cold region,
wherein the respective plane includes multiple blocks, at least one reserved block, and at least one spare block, wherein the at least one reserved block is used for over-provisioning, and wherein the at least one spare block is used for bad block management.

16. The computer system of claim 10, wherein the next available wordline is in a first area or a second area of a block in the non-volatile memory, and wherein the first area is assigned as a nominal capacity region of the block and the second area is assigned as a reserved region of the block.

17. The computer system of claim 10, wherein when the respective wordline stores data only in a first ordered page, the respective wordline operates in an SLC mode;

wherein when the respective wordline stores data only in the first ordered page and a second ordered page of the respective wordline, the respective wordline operates in an MLC mode;

wherein when the respective wordline stores data only in the first ordered page, the second ordered page, and a third ordered page of the respective wordline, the respective wordline operates in a TLC mode; and wherein when the respective wordline stores data only in the first ordered page, the second ordered page, the third ordered page, and a fourth ordered page of the respective wordline, the respective wordline operates in a QLC mode.

18. An apparatus, comprising:

a communication module configured to receive a request to write data to a non-volatile memory comprising blocks with a plurality of wordlines, wherein a respective wordline is coupled to a plurality of pages across a plurality of cells, and wherein the pages are ordered by an increasing number of programmable bits per cell;

a version-determining unit configured to determine whether the data is an updated version of existing data stored in the non-volatile memory;

a data-writing unit configured to, in response to the version-determining unit determining that the data is not an updated version of existing data stored in the non-volatile memory, write the data to a first ordered page of a plurality of pages corresponding to a next available wordline; and wherein the data-writing unit is further configured to, in response to the version-determining unit determining that the data is an updated version of existing data stored in the non-volatile memory, write the data to a next available ordered page corresponding to an existing wordline in which the existing data is stored.

19. The apparatus of claim 18, further comprising:

a garbage-collecting unit configured to detect a condition which triggers a garbage collection process on a first block of the non-volatile memory;

wherein the garbage-collecting unit is further configured to identify a first set of pages which comprise a most recent version of data stored in the first block;

a data-classifying unit configured to classify, based on an access frequency of a respective page of the first set of pages, the respective page into a corresponding category of a set of categories;

wherein the data-writing unit is configured to write the respective classified page into one of a plurality of similarly classified regions of the non-volatile memory based on the corresponding category for the respective classified page; and wherein the garbage-collecting unit is configured to erase the first block.

20. The apparatus of claim 18, wherein the data is written as multiple replicas in a distributed storage system, and wherein the apparatus further comprises:

a data-migrating module configured to determine that a first replica stored in a warm block in the warm region meets a first predetermined threshold for being moved to an archival storage, wherein the data-writing module is further configured to write the first replica to the archival storage and freeing up the warm block to store incoming data;

wherein the data-migrating module is further configured to determine that that a second replica stored in a cold block in the cold region meets a second predetermined threshold for being moved to the archival storage; and wherein the data-writing module is further configured to write the second replica to the archival storage and freeing up the cold block to store incoming data.

* * * * *